United States Patent [19]

Hayashi et al.

[11] Patent Number: 5,960,019
[45] Date of Patent: Sep. 28, 1999

[54] SEMICONDUCTOR LASER DEVICE AND METHOD OF DESIGNING THE SAME

[75] Inventors: Nobuhiko Hayashi, Osaka; Daisuke Ide; Akira Ibaraki, both of Hirakata, all of Japan

[73] Assignee: Sanyo Electric Co., LTD., Moriguchi, Japan

[21] Appl. No.: 08/828,034

[22] Filed: Mar. 27, 1997

[30] Foreign Application Priority Data

Mar. 28, 1996 [JP] Japan ................................. 8-074737
Sep. 30, 1996 [JP] Japan ................................. 8-259648

[51] Int. Cl.$^6$ ........................................... H01S 3/19
[52] U.S. Cl. ................................. 372/46; 372/45
[58] Field of Search ................... 372/46, 45; 437/129

[56] References Cited

U.S. PATENT DOCUMENTS 5,036,521  7/1991  Hatakoshi et al. ........................ 372/45
5,587,334  12/1996 Naito et al. ............................... 437/129
5,748,659  5/1998  Kimura et al. ............................ 372/46

FOREIGN PATENT DOCUMENTS 62-46584  2/1987  Japan .

OTHER PUBLICATIONS

A. Shima et al; IEEE Journal of Selected Topics in Quantum Electronics, vol. 1, No. 2, pp. 102–109, Jun. 1995.
N. Kaneno et al; Extended Abstracts of the 18th (1986 International) Conference on Solid State Devices and Materials; pp. 173–176, 1986. (no month available).
O. Imafuji et al; IEEE Journal of Quantum Electronics, vol. 29, No. 6, pp. 1889–1894; Jun. 1993.
T. Takayama et al; Jpn. J. Appl. Phys. vol. 34, Part.1, No. 7A, pp. 3533–3542, Jul. 1995.

*Primary Examiner*—Rodney Bovernick
*Assistant Examiner*—Yisun Song
*Attorney, Agent, or Firm*—Armstrong, Westerman, Hattori, McLeland, & Naughton

[57] ABSTRACT

A semiconductor laser device comprises a cladding layer of a first conductivity type, an active layer, a cladding layer of a second conductivity type, and a current blocking layer having a stripe-shaped opening having a predetermined width W for restricting a current path and forming the current path, and having a larger band gap than that of the cladding layer of the second conductivity type and having a smaller refractive index than that of the cladding layer of the second conductivity type. A difference Δn between effective refractive indexes in a region, which corresponds to the opening, in the active layer and an effective refractive index in a region, which corresponds to both sides of the opening, in the active layer and the width W (μm) of the opening are so set as to satisfy a predetermined relationship. The difference Δn between the effective refractive indexes is set by selecting the Al composition ratio of the current blocking layer and the thickness of the cladding layer of the second conductivity type on the both sides of the opening.

46 Claims, 8 Drawing Sheets

SEMICONDUCTOR LASER DEVICE AND METHOD OF DESIGNING THE SAME

BACKGROUND OF THE INVENTION

1. Field of the Invention

The present invention relates to a semiconductor laser device and a method of designing the same.

2. Description of the Background Art

In recent years, semiconductor laser devices operable at a low operating current have been actively studied and developed. IEEE JOURNAL OF SELECTED TOPICS IN QUANTUM ELECTRONICS, VOL.1, NO.2, PP.102–109, 1995 has reported that in a real refractive index guided semiconductor laser employing a transparent current blocking layer, its operating current can be reduced.

In such a real refractive index guided semiconductor laser device, it is considered that a transverse mode is stabilized when a real refractive index difference is large to some extent. For example, in the above-mentioned document, the real refractive index difference is approximately $5 \times 10^{-3}$.

In the above-mentioned real refractive index guided semiconductor laser device employing a transparent current blocking layer, however, it is difficult to make light output power higher in fundamental transverse mode lasing.

Furthermore, in the above-mentioned real refractive index guided semiconductor laser device, the loss inside of a cavity can be decreased, whereby high light output power is possible. When the semiconductor laser device is used in an optical pickup as a light source for a rewritable optical disc such as a magneto-optical disc or a phase change disc, however, realization of higher light output power of the semiconductor laser davice is required. In addition, when writing at more than fourfold speed, it is desired that with respect to the output power of the laser device, maximum light output power is not less than 70 mW in fundamental transverse mode lasing, and a horizontal beam divergence $\theta_H$ in the horizontal direction is not less than 6.5° in order to reduce noise characteristics or the like in a case where the semiconductor device is carried by the optical pickup.

SUMMARY OF THE INVENTION

An object of the present invention is to provide a semiconductor laser device capable of obtaining high light output power in fundamental transverse mode lasing and a method of designing the same.

Another object of the present invention is to provide a semiconductor laser device capable of increasing maximum light output power in fundamental transverse mode lasing and increasing a horizontal beam divergence $\theta_H$ in the horizontal direction and a method of designing the same.

A semiconductor laser device according to the present invention comprises a cladding layer of a first conductivity type, an active layer, a cladding layer of a second conductivity type, and a current blocking layer having a stripe-shaped opening of a predetermined width for restricting a current path and forming the current path, and having a larger band gap than that of the cladding layer of the second conductivity type and having a lower refractive index than that of the cladding layer of the second conductivity type in this order, the cladding layer of the second conductivity type having a flat portion and a stripe-shaped ridge portion on the flat portion, the ridge portion being positioned in the opening of the current blocking layer, the current blocking layer being so formed as to cover the upper surface of the flat portion and the side surface of the ridge portion, and a difference $\Delta n$ between a real refractive index in a region, which corresponds to the opening, in the active layer (that is, a region, which faces the opening, in a light emitting region or/and a region, which includes the opening, in the light emitting region) and a real refractive index in a region, which corresponds to both sides of the opening, in the active layer (that is, a region, which faces to both sides of the opening, in the light emitting region or/and a region, which includes both sides of the opening, in the light emitting region) and the width W [μm] of the opening satisfying the following relationship:

$$\Delta n \geq 2 \times 10^{-3},$$

$$W \leq -1.6 \times 10^3 \times \Delta n + 9.3, \text{ and}$$

$$W \geq 3.0$$

In this case, a so-called ridge wave guided semiconductor laser device is provided. The width of the ridge portion at a distance away from the active layer may decrease as the distance increases.

In the semiconductor laser device, high light output power can be obtained at a low operating current and in fundamental transverse mode lasing. For example, it is possible to obtain light output power of not less than 100 mW.

Since the difference $\Delta n$ between the real refractive indexes is not less than $2 \times 10^{-3}$, a real refractive index guided structure is kept good. Since the width W of the opening is not less than 3.0 μm, high reliability is obtained.

It is more preferable that the difference $\Delta n$ between the real refractive indexes and the width W of the opening satisfy the following relationship:

$$W \leq -1.5 \times 10^3 \times \Delta n + 8.55$$

In this case, light output power of not less than 150 mW is obtained in fundamental transverse mode lasing.

The cladding layer of the first conductivity type may be composed of $Al_xGa_{1-x}As$, the active layer may be composed of $Al_qGa_{1-q}As$ ($1 > x > q \geq 0$), the cladding layer of the second conductivity type may be composed of $Al_yGa_{1-y}As$ ($y > q$), and the current blocking layer may be composed of $Al_zGa_{1-z}As$.

In this case, high light output power is obtained at a low operating current and in fundamental transverse mode lasing. For example, it is possible to obtain light output power of not less than 100 mW in fundamental transverse mode lasing.

The difference $\Delta n$ between the real refractive indexes may be set by selecting the Al composition ratio z of the current blocking layer and the thickness of the cladding layer of the second conductivity type on the both sides of the opening.

It is preferable that the Al composition ratio x of the cladding layer of the first conductivity type and the Al composition ratio y of the cladding layer of the second conductivity type are not less than 0.4 nor more than 0.6.

It is preferable that the Al composition ratio z of the current blocking layer is higher than the Al composition ratio y of the cladding layer of the second conductivity type. It is more preferable that the difference between the Al composition ratio z of the current blocking layer and the Al composition ratio y of the cladding layer of the second conductivity type is not less than 0.02. In this case, it is possible to easily realize a good difference between the real refractive indexes.

It is preferable that the Al composition ratio z of the current blocking layer is not more than 0.6. Consequently, the crystallinity of the current blocking layer is increased, whereby the crystallinity of a layer formed on the current blocking layer is also increased. As a result, it is possible to provide a semiconductor laser device with high reliability.

It is preferable that the current blocking layer comprises at least a layer of the first conductivity type. In this case, the layer of the first conductivity type in the current blocking layer and the cladding layer of the second conductivity type are of opposite conductivity types, whereby sufficient current blocking is possible. The current blocking layer may be constituted by only the layer of the first conductivity type.

The current blocking layer may comprise a first layer formed on the active layer and a second layer formed on the first layer, the second layer may be of the first conductivity type, and the first layer may have a lower impurity concentration than that of the second layer. In this case, impurities can be prevented from being diffused into the active layer from the current blocking layer. Particularly, it is preferable that the first layer is an undoped layer.

When the current blocking layer is constituted by the layer of the first conductivity type, the impurity concentration of the current blocking layer at a distance away from the active layer may decrease as the distance decreases.

Another layer having a thickness of not more than 300 Å such as an etching stop layer may exist in the cladding layer of the second conductivity type because the difference between the real refractive indexes is hardly affected.

Furthermore, a current blocking layer of the first conductivity type absorbing lasing light may be provided on the current blocking layer.

It is preferable that the cladding layer of the first conductivity type is formed on a semiconductor substrate of the first conductivity type. In the AlGaAs system semiconductor laser device, it is preferable to use a GaAs substrate.

The active layer may have a single quantum well structure composed of a single quantum well layer, may have a multi quantum well structure constructed by alternately stacking quantum well layers and barrier layers, or may be a single layer having no quantum effect.

The multi quantum well structure of the AlGaAs system semiconductor laser device may comprise quantum well layers composed of $Al_qGa_{1-q}As$ ($1>x>q\geq 0$, $1>y>q\geq 0$) and barrier layers composed of $Al_pGa_{1-p}As$ ($x\geq p>q$, $y\geq p>q$).

It is preferable that the semiconductor laser device achieves light output power of not less than 100 mw in fundamental transverse mode lasing. It is more preferable that the semiconductor laser device achieves light output power of not less than 150 mW in fundamental transverse mode lasing.

A method of designing a semiconductor laser device according to another aspect of the present invention is a method of designing a semiconductor laser device comprising a cladding layer of a first conductivity type composed of $Al_xGa_{1-x}As$, an active layer composed of $Al_qGa_{1-q}As$ ($1>x>q\geq 0$), a cladding layer of a second conductivity type composed of $Al_yGa_{1-y}As$ ($y>q$), and a current blocking layer having a stripe-shaped opening of a predetermined width for restricting a current path and forming the current path and composed of $Al_zGa_{1-z}As$ ($1\geq z>y$) in this order, which comprises the steps of setting a difference $\Delta n$ between a real refractive index in a region, which corresponds to the opening, in the active layer and a real refractive index in a region, which corresponds to both sides of the opening, in the active layer and the width W of the opening in order that predetermined light output power is obtained in fundamental transverse mode lasing, and selecting the Al composition ratio z of the current blocking layer and the thickness of the cladding layer of the second conductivity type on the both sides of the opening in order that the difference $\Delta n$ between the real refractive indexes is obtained.

Consequently, a semiconductor laser device achieving high light output power at a low operating current and in fundamental transverse mode lasing is obtained.

It is preferable that the setting step comprises the step of setting the difference $\Delta n$ between the real refractive indexes and the width W [$\mu$m] of the opening in order to satisfy the following relationships:

$\Delta n \geq 2 \times 10^{-3}$, and $W \leq -1.6 \times 10^3 \times \Delta n + 9.3$ Consequently, a semiconductor laser device achieving light output power of not less than 100 mW in fundamental transverse mode lasing is obtained.

It is more preferable that the setting step comprises the step of setting the difference $\Delta n$ between the real refractive indexes and the width W [$\mu$m] of the opening in order to satisfy the following relationship:

$W \leq -1.5 \times 10^3 \times \Delta n + 8.55$

Consequently, a semiconductor laser device achieving light output power of not less than 150 mW in fundamental transverse mode lasing is obtained.

It is preferable that the setting step comprises the step of setting the width W of the opening to not less than 3.0 $\mu$m. Consequently, a semiconductor laser device with high reliability is obtained.

The cladding layer of the second conductivity type may comprise a flat portion and a stripe-shaped ridge portion on the flat portion, the ridge portion may be positioned in the opening of the current blocking layer, and the current blocking layer may be so formed as to cover the upper surface of the flat portion and the side surface of the ridge portion. In this case, a so-called ridge wave guided semiconductor laser device is provided. The width of the ridge portion at a distance away from the active layer may decrease as the distance increases.

A semiconductor laser device according to still another aspect of the present invention comprises a cladding layer of a first conductivity type, an active layer, a cladding layer of a second conductivity type, and a current blocking layer having a stripe-shaped opening of a predetermined width for restricting a current path and forming the current path, and having a larger band gap than that of the cladding layer of the second conductivity type and having a smaller refractive index than that of the cladding layer of the second conductivity type in this order, the cladding layer of the second conductivity type having a flat portion and a stripe-shaped ridge portion on the flat portion, the ridge portion being positioned in the opening of the current blocking layer, the current blocking layer being so formed as to cover the upper surface of the flat portion and the side surface of the ridge portion, and a difference $\Delta n$ between a real refractive index in a region, which corresponds to the opening, in the active layer and a real refractive index in a region, which corresponds to both sides of the opening, in the active layer and the width W [$\mu$m] of the opening satisfying the following relationships:

$2.4 \times 10^{-3} \leq \Delta n \leq 3.5 \times 10^{-3}$, $W \geq 2.5$, $W \leq -1.33 \times 10^3 \times \Delta n + 8.723$, and $W \leq 2.25 \times 10^3 \times \Delta n - 2.8$ In this case, a so-called ridge wave guided semiconductor laser device is provided. The width of the ridge portion at a distance away from the active layer may decrease as the distance increases.

In the semiconductor laser device according to the present invention, high maximum light output power and a large horizontal beam divergence can be obtained in fundamental transverse mode lasing. It is possible to increase the maximum light output power to not less than 70 mW, for example, in fundamental transverse mode lasing as well as to increase the horizontal beam divergence to not less than 6.5°, for example.

It is more preferable that the difference $\Delta n$ between the real refractive indexes and the width W [$\mu$m] of the opening satisfy the following relationship:

$$W \leq -1.33 \times 10^3 \times \Delta n + 7.923$$

In this case, maximum light output power of not less than 100 mW is achieved in fundamental transverse mode lasing.

It is more preferable that the difference $\Delta n$ between the real refractive indexes and the width W [$\mu$m] of the opening satisfy the following relationship:

$$W \leq 2.25 \times 10^3 \times \Delta n - 3.175$$

In this case, it is possible to increase the horizontal beam divergence to not less than 70°.

The cladding layer of the first conductivity type may be composed of $Al_xGa_{1-x}As$, the active layer may be composed of $Al_qGa_{1-q}As$ ($1>x>q\geq0$), the cladding layer of the second conductivity type may be composed of $Al_yGa_{1-y}As$ (y>q), and the current blocking layer may be composed of $Al_zGa_{1-z}As$.

In this case, maximum light output power of not less than 70 mW can be obtained in fundamental transverse mode lasing, and the horizontal beam divergence can be not less than 6.5°.

The difference $\Delta n$ between the real refractive indexes may be set by selecting the Al composition ratio z of the current blocking layer and the thickness of the cladding layer of the second conductivity type on the both sides of the opening.

It is preferable that the Al composition ratio x of the cladding layer of the first conductivity type and the Al composition ratio y of the cladding layer of the second conductivity type are not less than 0.4 nor more than 0.6.

It is preferable that the Al composition ratio z of the current blocking layer is higher than the Al composition ratio y of the cladding layer of the second conductivity type. It is more preferable that a difference between the Al composition ratio z of the current blocking layer and the Al composition ratio y of the cladding layer of the second conductivity type is not less than 0.02. In this case, it is possible to easily realize a good difference between the real refractive indexes.

It is preferable that the Al composition ratio z of the current blocking layer is not more than 0.6. Consequently, the crystallinity of the current blocking layer is increased, whereby the crystallinity of a layer formed on the current blocking layer is also increased. As a result, it is possible to provide a semiconductor laser device with high reliability.

It is preferable that the current blocking layer comprises at least a layer of the first conductivity type. In this case, the layer of the first conductivity type in the current blocking layer and the cladding layer of the second conductivity type are of opposite conductivity types, whereby sufficient current blocking is possible. The current blocking layer may be constituted by only the layer of the first conductivity type.

The current blocking layer may comprise a first layer formed on the active layer and a second layer formed on the first layer, the second layer may be of the first conductivity type, and the first layer may have a lower impurity concentration than that of the second layer. In this case, impurities can be prevented from being diffused into the active layer from the current blocking layer. Particularly, it is preferable that the first layer is an undoped layer.

When the current blocking layer is constituted by the layer of the first conductivity type, the impurity concentration of the current blocking layer at a distance away from the active layer may decrease as the distance decreases.

Another layer having a thickness of not more than 300 Å such as an etching stop layer may exist in the cladding layer of the second conductivity type because the difference between the real refractive indexes is hardly affected.

Furthermore, a current blocking layer of the first conductivity type absorbing lasing light may be provided on the current blocking layer.

It is preferable that the cladding layer of the first conductivity type is formed on a semiconductor substrate of the first conductivity type. In the AlGaAs system semiconductor laser device, it is preferable to use a GaAs substrate.

The active layer may have a single quantum well structure composed of a single quantum well layer, may have a multi quantum well structure constructed by alternately stacking quantum well layers and barrier layers, or may be a single layer having no quantum effect.

The multi quantum well structure of the AlGaAs system semiconductor laser device may comprise quantum well layers composed of $Al_qGa_{1-q}As$ ($1>x>q\geq0$, $1>y>q\geq0$) and barrier layers composed of $Al_pGa_{1-p}As$ ($x\geq p>q$, $y\geq p>q$).

It is preferable that the semiconductor laser device achieves maximum light output power of not less than 70 mW in fundamental transverse mode lasing. It is more preferable that the semiconductor laser device achieves maximum light output power of not less than 100 mW in fundamental transverse mode lasing. On the other hand, it is preferable that the semiconductor laser device achieves a horizontal beam divergence of not less than 6.5°. It is more preferable that the semiconductor laser device achieves a horizontal beam divergence of not less than 7°.

As a beam approximates to a complete round, optical setting in an optical pickup can be facilitated. Since a vertical beam divergence is larger than the horizontal beam divergence, for example, approximately 15 to 30°, the horizontal beam divergence may be large to the same extent as the vertical beam divergence.

Additionally, as the cavity length decreases, the horizontal beam divergence can be made slightly larger. On the other hand, if the cavity length is less than approximately 300 $\mu$m, the level of COD (catastrophic optical damage) decreases. Consequently, it is preferable that the cavity length is in the range of not less than 300 $\mu$m nor more than 600 $\mu$m.

A method of designing a semiconductor laser device according to a further aspect of the present invention is a method of designing a semiconductor laser device comprising a cladding layer of a first conductivity type composed of $Al_xGa_{1-x}As$, an active layer composed of $Al_qGa_{1-q}As$ ($1>x>q\geq0$), a cladding layer of a second conductivity type composed of $Al_yGa_{1-y}As$ (y>q), and a current blocking layer having a stripe-shaped opening of a predetermined width for restricting a current path and forming the current path and composed of $Al_zGa_{1-z}As$ ($1\geq z>y$) in this order, which comprises the steps of setting a difference $\Delta n$ between a real refractive index in a region, which corresponds to the opening, in the active layer and a real refractive index in a region, which corresponds to both sides of the opening, in the active layer and the width W of the opening in order that predetermined maximum light output power and a predetermined horizontal beam divergence are obtained in fundamental transverse mode lasing, and selecting the Al composition ratio z of the current blocking layer and the thickness of the cladding layer of the second conductivity type on the both sides of the opening in order that the difference Δn between the real refractive indexes is obtained.

Consequently, a semiconductor laser achieving high maximum light output power in fundamental transverse mode lasing and a large horizontal beam divergence is obtained.

It is preferable that the setting step comprises the step of setting the difference Δn between the real refractive indexes and the width W [μm] of the opening in order to satisfy the following relationships:

$$2.4 \times 10^{-3} \leq \Delta n \leq 3.5 \times 10^{-3},$$

$$W \geq 2.5,$$

$$W \leq -1.33 \times 10^3 \times \Delta n + 8.723, \text{ and}$$

$$W \leq 2.25 \times 10^3 \times \Delta n - 2.8$$

Consequently, a semiconductor laser device achieving maximum light output power of not less than 70 mW in fundamental transverse mode lasing and a horizontal beam divergence of not less than 6.5° is obtained.

It is more preferable that the setting step comprises the step of setting the difference Δn between the real refractive indexes and the width W [μm] of the opening in order to satisfy the following relationship:

$$W \leq -1.33 \times 10^3 \times \Delta n + 7.923$$

In this case, a semiconductor laser device achieving maximum light output power of not less than 100 mW in fundamental transverse mode lasing is obtained.

It is preferable that the setting step comprises the step of setting the difference Δn between the real refractive indexes and the width W [μm] of the opening in order to satisfy the following relationship:

$$W \leq 2.25 \times 10^3 \times \Delta n - 3.175$$

In this case, a semiconductor laser device achieving a horizontal beam divergence of not less than 7° is obtained.

The cladding layer of the second conductivity type may comprise a flat portion and a stripe-shaped ridge portion on the flat portion. The ridge portion may be positioned in the opening of the current blocking layer, and the current blocking layer may be so formed as to cover the upper surface of the flat portion and the side surface of the ridge portion. In this case, a so-called ridge wave guided semiconductor laser device is provided. The width of the ridge portion at a distance away from the active layer may decrease as the distance increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An AlGaAs system semiconductor laser device according to a first embodiment of the present invention will be described using FIG. 1.

Figure 1:
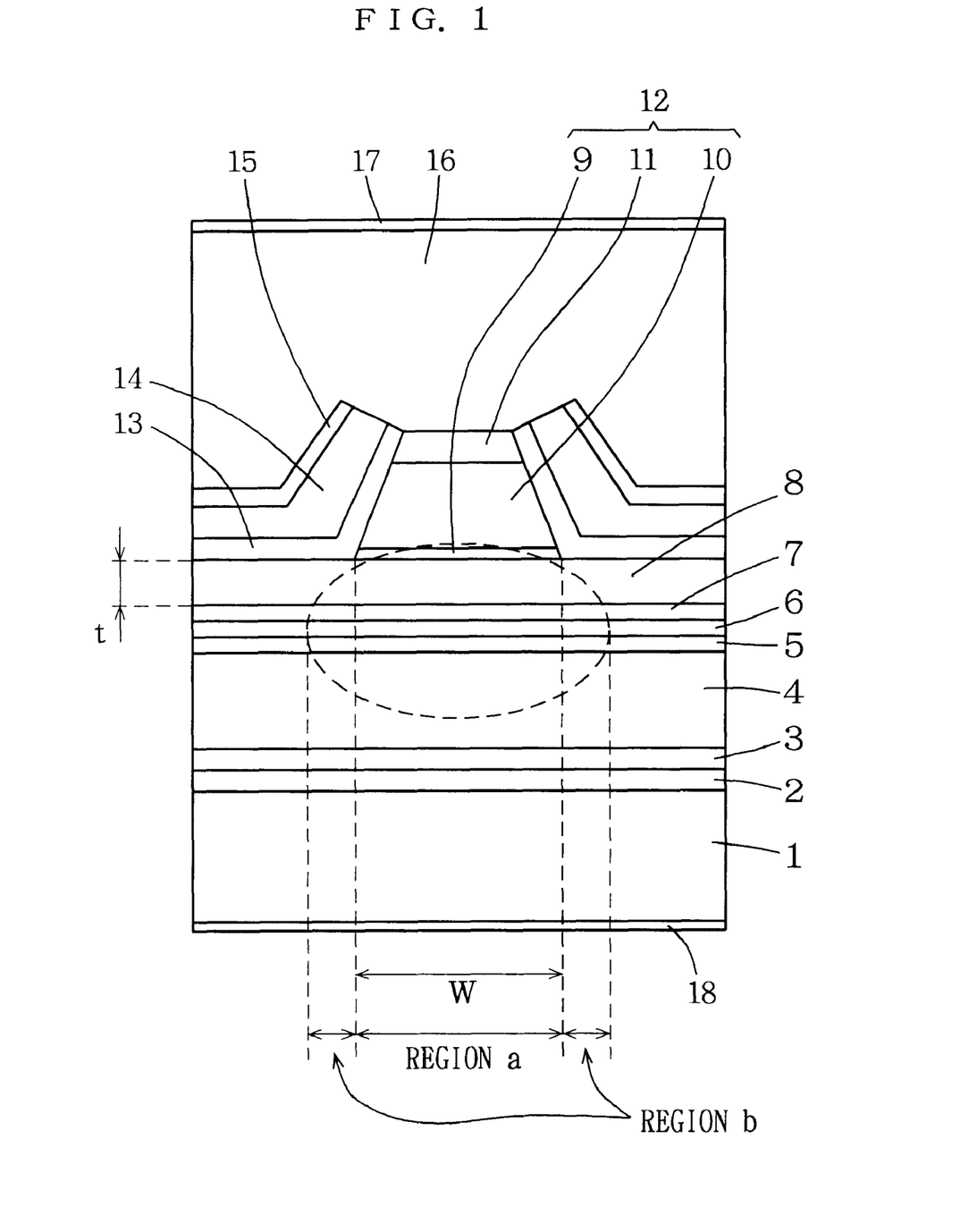
FIG. 1 is a schematic cross-sectional view of a semiconductor laser device according to a first embodiment of the present invention.

In FIG. 1, an Se doped n-type GaAs buffer layer 2 having a thickness of 0.5 μm, an Se doped n-type $Al_sGa_{1-s}As$ buffer layer 3 having a thickness of 0.1 μm, and an Se doped n-type $Al_xGa_{1-x}As$ cladding layer 4 having a thickness of 2.3 μm are formed in this order on an n-type GaAs substrate 1, where x>s>0. In the present embodiment, s=0.18 and x=0.45.

An undoped $Al_vGa_{1-v}As$ optical guide layer 5 having a thickness of 410 Å, an undoped active layer 6 having a single quantum well structure composed of $Al_qGa_{1-q}As$ having a thickness of 100 Å, and an undoped $Al_wGa_{1-w}As$ optical guide layer 7 having a thickness of 410 Å are formed in this order on the n-type cladding layer 4, where 1>x>v, v>q≧0 and w>q≧0, and y1>w and y2>w. In the present embodiment, v=0.35, q=0.035, and w=0.35.

A Zn doped p-type $Al_{y1}Ga_{1-y1}As$ cladding layer 8 having a thickness of t μm is formed on the optical guide layer 7. In the present embodiment, y1=0.45.

A stripe-shaped Zn doped p-type $Al_uGa_{1-u}As$ etching stop layer 9 having a thickness of 200 Å extending in the vertical direction (in the direction of the cavity length), a stripe-shaped Zn doped p-type $Al_{y2}Ga_{1-y2}As$ cladding layer 10 having a thickness of 2 μm, and a stripe-shaped Zn doped p-type GaAs cap layer 11 having a thickness of 0.4 μm are formed in this order on an approximately central part of the p-type cladding layer 8. The p-type etching stop layer 9 has a width W μm. The width W μm becomes the width of an opening forming a current path. Here, 1≧u>y1 and 1≧u>y2. In the present embodiment, u=0.7 and y2=0.45. The p-type etching stop layer 9, the p-type cladding layer 10, and p-type cap layer 11 constitute a stripe-shaped ridge portion 12.

An undoped $Al_{z1}Ga_{1-z1}As$ current blocking layer 13 having a thickness of 0.3 μm, an Se doped n-type $Al_{z2}Ga_{1-}$ z2As current blocking layer 14 having a thickness of 0.2 μm, and an Se doped n-type GaAs current blocking layer 15 having a thickness of 0.3 μm are formed in this order on the p-type cladding layer 8 so as to cover the side surface of the ridge portion 12, where $1 \geq z1 > y1$, $1 \geq z1 > y2$, $1 \geq z2 > y1$, and $1 \geq z2 > y2$.

A Zn doped p-type GaAs contact layer 16 having a thickness of 6 μm is formed on the upper surface of the p-type cap layer 11, the end surface of the undoped current blocking layer 13, the end surface of the n-type current blocking layer 14, and the upper surface and the end surface of the n-type current blocking layer 15.

A p-side electrode 17 composed of Cr/Au is formed on the p-type contact layer 16, and an n-side electrode 18 composed of Cr/Sn/Au is formed on the lower surface of the n-type substrate 1.

Description is now made of one example of a method of fabricating the above-mentioned semiconductor laser device.

First, the n-type GaAs buffer layer 2, the n-type AlGaAs buffer layer 3, the n-type AlGaAs cladding layer 4, the undoped AlGaAs optical guide layer 5, the undoped active layer 6, the undoped AlGaAs optical guide layer 7, the p-type AlGaAs cladding layer (a flat portion) 8, the p-type AlGaAs or AlAs etching stop layer 9, the p-type cladding layer (corresponding to a ridge portion formed later) 10, and the p-type GaAs cap layer 11 are continuously grown on the n-type GaAs substrate 1 by the vapor phase epitaxy (VPE) method such as the metal organic chemical vapor deposition (MOCVD) method or the molecular beam epitaxy (MBE) method. The p-type cap layer 11 is a protective layer for preventing the impossibility of crystal growth on the p-type cladding layer 10 by exposure and oxidation of the p-type cladding layer 10 in the fabrication processes.

A stripe-shaped $SiO_2$ film is then formed on the p-type GaAs cap layer 11, and the layers under the p-type etching stop layer 9 are selectively etched away using the $SiO_2$ film as a mask, after which the etching stop layer 9 is also etched away with the $SiO_2$ film used as the mask, to form the ridge portion 12. Since the etching stop layer 9 has a high Al composition ratio, it is difficult to grow a crystal having good crystallinity on the etching stop layer 9 after the etching step. Therefore, the etching stop layer 9 is removed in the present embodiment.

The current blocking layers 13, 14, and 15 are then continuously grown in this order by the above-mentioned vapor phase epitaxy method on the cladding layer 8 so as to cover the side surface of the ridge portion 12, to expose the upper surface of the cap layer 11. Thereafter, the p-type GaAs contact layer 16 is grown by the above-mentioned vapor phase epitaxy method on the upper surfaces of the current blocking layers 13, 14 and 15 and the cap layer 11.

In the semiconductor laser device, the current blocking layers 13 and 14 having a stripe-shaped opening (having a stripe width W) for restricting a current path as well as forming the current path have larger band gaps and smaller refractive indexes than those of the p-type cladding layers 8 and 10. Consequently, in a light emitting region (a region schematically indicated by an ellipse of a dotted line in FIG. 1), a real refractive index in a region a corresponding to the opening can be made larger than a real refractive index in a region b corresponding to both sides of the opening. Consequently, the semiconductor laser device is operable as a real refractive index guided semiconductor laser device. A real refractive index difference means a difference between the refractive index of light having a lasing wavelength sensed in the region a and the refractive index of the light sensed in the region b.

By the above-mentioned construction, the current blocking layers 13 and 14 become transparent current blocking layers which are transparent to lasing light.

Figure 2:
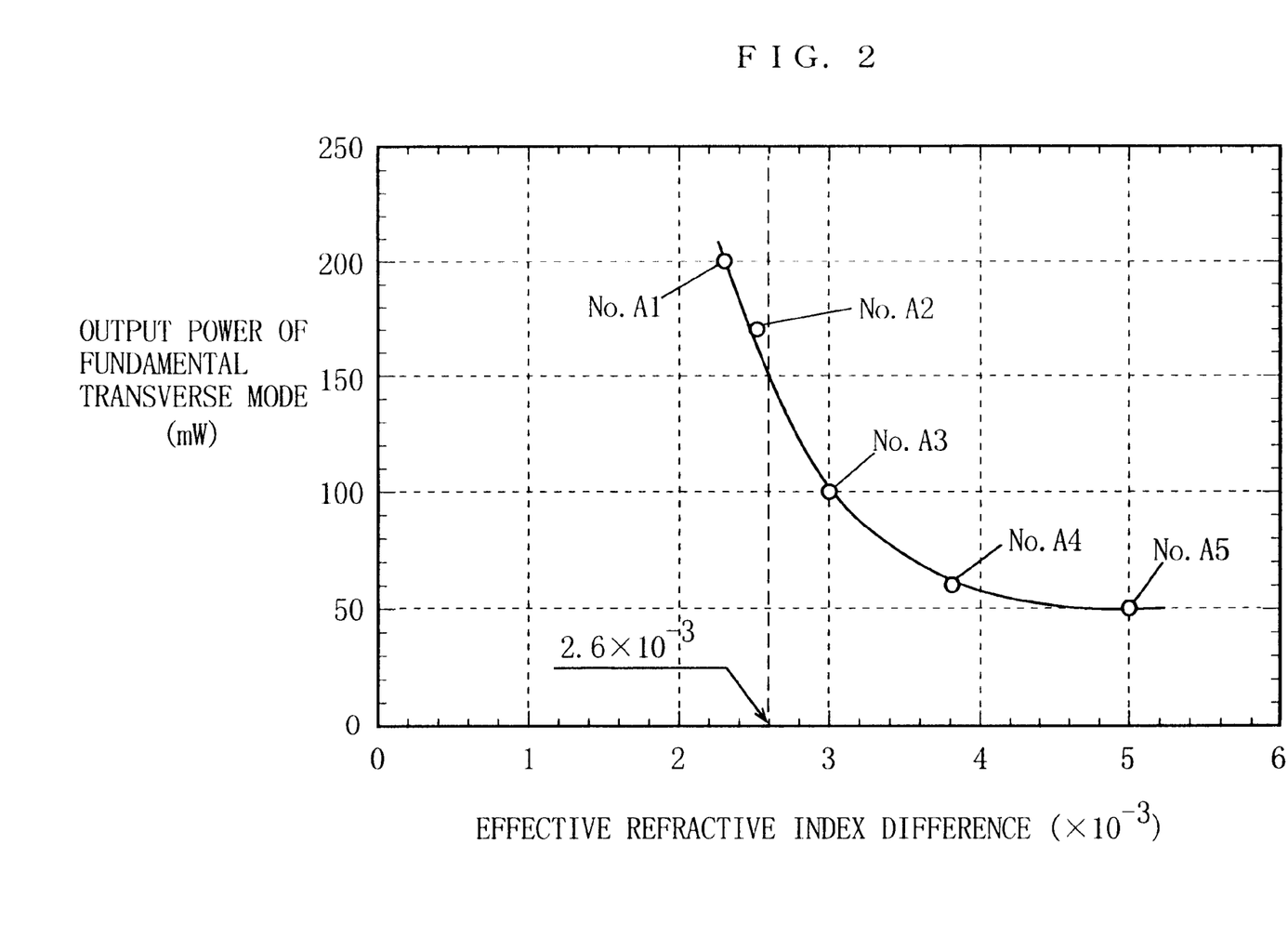
FIG. 2 is a diagram showing the relationship between a real refractive index difference Δn and maximum light output power Pk obtained when fundamental transverse mode lasing is possible in the semiconductor laser device shown in FIG. 1.

The real refractive index difference in a case where the semiconductor laser device is not operated (the real refractive index in the region a corresponding to the opening minus the real refractive index in the region b corresponding to both sides of the opening) is changed by selecting the respective Al composition ratios z1 and Z2 of the current blocking layers 13 and 14 or the thickness t of the cladding layer 8, to measure maximum light output power in fundamental transverse mode lasing. The results are shown in FIG. 2. In this case, a reflective film having an index of reflection of 2% and a reflective film having an index of reflection of 95% are respectively provided on a front facet and a rear facet of the semiconductor laser device, and the cavity length is set to 1200 μm, to make measurements at an ambient temperature of 25° C. The respective Al composition ratios z1 and z2 of the current blocking layers 13 and 14 and the thickness t of the p-type cladding layer 8 at respective points shown in FIG. 2 are shown in Table 1. The stripe widths of samples Nos. A1 to A5 are 4.5 μm.

TABLE 1

| No. | Al COMPOSITION RATIO z1 OF CURRENT BLOCKING LAYER 13 | Al COMPOSITION RATIO z2 OF CURRENT BLOCK-ING LAYER 14 | THICKNESS t OF p-TYPE CLADDING LAYER 8 (μm) |
|---|---|---|---|
| A1 | 0.53 | 0.53 | 0.25 |
| A2 | 0.55 | 0.55 | 0.25 |
| A3 | 0.59 | 0.59 | 0.25 |
| A4 | 0.70 | 0.70 | 0.25 |
| A5 | 0.70 | 0.70 | 0.15 |

FIG. 2 shows that the maximum light output power obtained when fundamental transverse mode lasing is possible is not less than 100 mW when the real refractive index difference is not more than $3 \times 10^{-3}$, not less than 150 mW when the real refractive index difference is not more than $2.6 \times 10^{-3}$, and not less than 200 mW when the real refractive index difference is not more than $2.3 \times 10^{-3}$.

Additionally, a lasing threshold current of 43 mA, an operating current of 140 mA, a vertical beam divergence of 18°, and a horizontal beam divergence of 7° are obtained in the light output power of 100 mW when the real refractive index difference is not more than $3 \times 10^{-3}$, while a lasing threshold current of 45 mA, an operating current of 185 mA, a vertical beam divergence of 18°, and a horizontal beam divergence of 7° are obtained in the light output power of 170 mW when the real refractive index difference is not more than $2.5 \times 10^{-3}$.

When the real refractive index difference is not more than $2.3 \times 10^{-3}$, a lasing threshold current of 47 mA, an operating current of 235 mA, a vertical beam divergence of 18°, and a horizontal beam divergence of 6.5° are obtained in the light output power of 200 mW.

When the real refractive index difference is thus not more than $3 \times 10^{-3}$, high light output power is obtained at a low operating current in fundamental transverse mode lasing.

Consequently, in the semiconductor laser device according to the present embodiment, the real refractive index difference is set to not more than $3 \times 10^{-3}$ and preferably not more than $2.6 \times 10^{-3}$.

The real refractive index difference Δn in a case where the semiconductor laser device is not operated (the real refractive index in the region a corresponding to the opening minus the real refractive index in the region b corresponding to both sides of the opening) is changed by selecting the respective Al composition ratios z1 and z2 of the current blocking layers 13 and 14, the thickness t of the p-type cladding layer 8, and the stripe width W, to measure maximum light output power Pk in fundamental transverse mode lasing. The results are shown in Table 2. In this case, a reflective film having an index of reflection of 2% and a reflective film having an index of reflection of 95% are respectively provided on a front facet and a rear facet of the semiconductor laser device, and the cavity length is set to 1200 μm, to make measurements at an ambient temperatures of 25° C. Samples B4, B9, B14, B18, and B21 respectively correspond to the samples A1, A2, A3, A4, and A5.

TABLE 2

| No. | Δn | W (μm) | Pk (mW) |
|---|---|---|---|
| B1 | 0.0023 | 5.5 | 110 |
| B2 | 0.0023 | 5.1 | 150 |
| B3 | 0.0023 | 4.7 | 180 |
| B4 | 0.0023 | 4.5 | 200 |
| B5 | 0.0025 | 6.0 | 90 |
| B6 | 0.0025 | 5.4 | 95 |
| B7 | 0.0025 | 5.0 | 120 |
| B8 | 0.0025 | 4.8 | 150 |
| B9 | 0.0025 | 4.5 | 170 |
| B10 | 0.0025 | 4.2 | 200 |
| B11 | 0.0030 | 5.7 | 80 |
| B12 | 0.0030 | 5.3 | 85 |
| B13 | 0.0030 | 4.9 | 90 |
| B14 | 0.0030 | 4.5 | 100 |
| B15 | 0.0030 | 4.3 | 120 |
| B16 | 0.0038 | 5.3 | 55 |
| B17 | 0.0038 | 4.9 | 60 |
| B18 | 0.0038 | 4.5 | 60 |
| B19 | 0.0050 | 5.5 | 45 |
| B20 | 0.0050 | 4.9 | 45 |
| B21 | 0.0050 | 4.5 | 50 |

Figure 3:
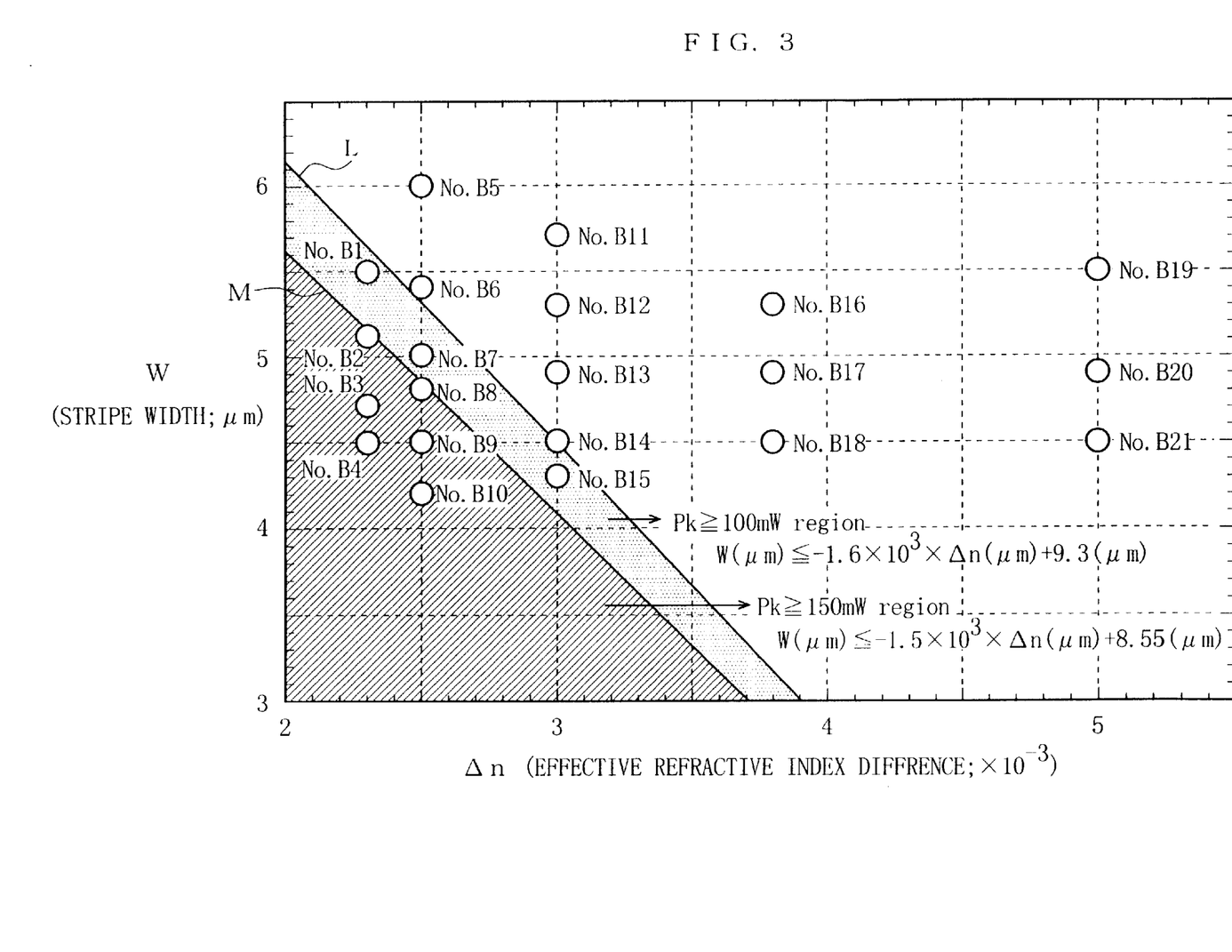
FIG. 3 is a diagram showing the relationship among a real refractive index difference Δn, maximum light output power Pk obtained when fundamental transverse mode lasing is possible, and a stripe width W in the semiconductor laser device shown in FIG. 1.

FIG. 3 shows the relationship among the real refractive index difference Δn, the maximum light output power Pk obtained when fundamental transverse mode lasing is possible, and the stripe width W which are obtained using the samples Nos. B1 to B21 in the Table 1. Fundamental transverse mode lasing is obtained in all the samples B1 to B21.

FIG. 3 shows that the stripe width W and the real refractive index difference Δn which satisfy a region below a straight line L, including the straight line L must be selected in order that the maximum light output power Pk is not less than 100 mW, and the stripe width W and the real refractive index difference Δn which satisfy a region below a straight line M, including the straight line M must be selected in order that the maximum light output power Pk is not less than 150 mW.

The straight line L is represented by the following equation (A1):

$$W=-1.6\times10^3\times\Delta n[\mu m]+9.3[\mu m] \quad (A1)$$

The straight line M is represented by the following equation (A2):

$$W=-1.5\times10^3\times\Delta n[\mu m]+8.55[\mu m] \quad (A2)$$

In the semiconductor laser device, the substantial real refractive index in the region a is decreased by approximately $10^{-3}$ upon injection of carriers into the region a when the semiconductor laser device is operated. Therefore, it is preferable that the real refractive index difference is not less than $2\times10^{-3}$ in order to keep a real refractive index guided structure good.

Particularly, it is preferable that the stripe width W is not less than 3.0 μm in terms of reliability. Specifically, it is preferable that the stripe width W is not less than 3.0 μm in order that the semiconductor laser device stably operates for not less than 1000 hours.

From the foregoing, the stripe width W and the real refractive index difference Δn are so selected as to satisfy the following relationships in order that the maximum light output power Pk is not less than 100 mW in fundamental transverse mode lasing:

$$\Delta n \geq 2\times10^{-3}$$

$$W \leq -1.6\times10^3[\mu m]\times\Delta n+9.3[\mu m]$$

$$W \geq 3.0[\mu m]$$

It is more preferable that the following relationship is satisfied in addition to the foregoing relationships in order that the maximum light output power Pk is not less than 150 mW in fundamental transverse mode lasing:

$$W \leq -1.5\times10^3[\mu m]\times\Delta n+8.55[\mu m]$$

A current blocking layer having a large band gap (having a high Al composition ratio) is relatively inferior in crystallinity. As a result, impurities may be diffused into the active layer 6 from the current blocking layer in growing the current blocking layer again. Moreover, the thickness of the p-type cladding layer 8 is set to a small value and preferably not more than 0.25 μm in order that the semiconductor laser device is formed into a real refractive index guided semiconductor laser device to reduce an unavailing current. In order to prevent the above-mentioned dispersion, therefore, the current blocking layer 13 on the side of the active layer 6 is preferably formed into a low impurity layer such as an undoped layer as in the present embodiment, and more preferably formed into an undoped layer as described above.

Although in the above-mentioned first embodiment, a single quantum well structure layer composed of $Al_qGa_{1-q}As$ (q≧0) is used as the active layer 6, a multi quantum well structure layer composed of $Al_qGa_{1-q}As$ well layers and $Al_pGa_{1-p}As$ barrier layers (p>q≧0) may be used as the active layer 6. Alternatively, a layer having no quantum effect composed of $Al_qGa_{1-q}As$ (q≧0) may be used as the active layer 6.

An AlGaAs system semiconductor laser device according to a second embodiment of the present invention will be described using FIGS. 4 and 5. In the semiconductor laser device shown in FIG. 4, portions corresponding to those in the semiconductor laser device shown in FIG. 1 are assigned the same reference numerals.

Figure 4:
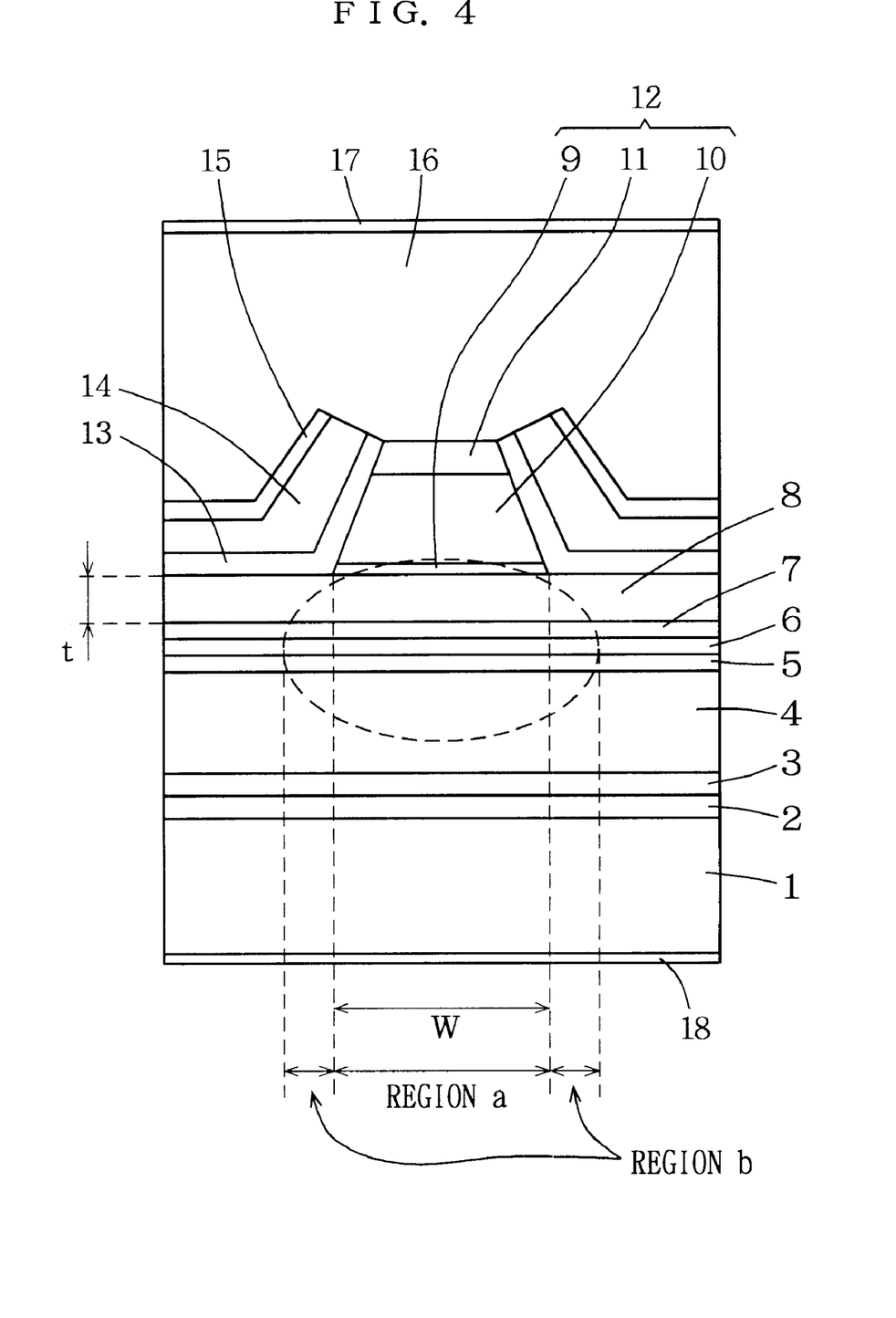
FIG. 4 is a schematic cross-sectional view of a semiconductor laser device according to a second embodiment of the present invention.
Figure 5:
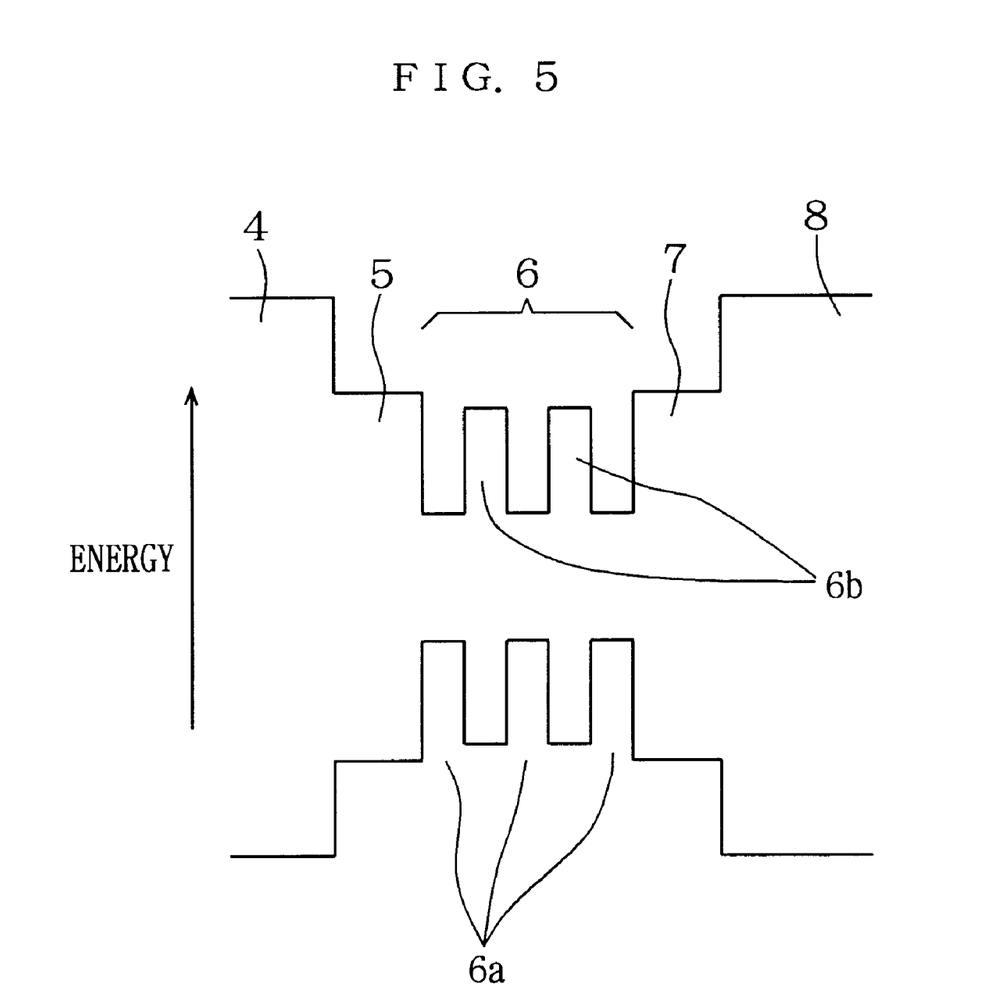
FIG. 5 is a diagram showing a schematic band structure in an active layer and the vicinity thereof in the semiconductor laser device shown in FIG. 4.

In FIG. 4, an Se doped n-type GaAs buffer layer 2 having a thickness of 0.5 μm, an Se doped n-type $Al_sGa_{1-s}As$ buffer layer 3 having a thickness of 0.1 μm, and an Se doped $Al_xGa_{1-x}As$ cladding layer 4 having a thickness of 2.2 μm are formed in this order on an n-type GaAs substrate 1, where x>s>0. In the present embodiment, s=0.18 and x=0.45.

An undoped $Al_vGa_{1-v}As$ optical guide layer 5 having a thickness of 200 Å, an undoped active layer 6, and an undoped $Al_vGa_{1-v}As$ optical guide layer 7 having a thickness of 200 Å are formed in this order on the n-type cladding layer 4, where 1>x>v. In the present embodiment, v=0.35. The active layer 6 is constructed by alternately stacking quantum well layers 6a composed of $Al_qGa_{1-q}As$ having a thickness of 80 Å and barrier layers 6b composed of $Al_pGa_{1-p}As$ having a thickness of 80 Å. Here $v \geq p > q \geq 0$ and $w \geq p > q \geq 0$. In the present embodiment, q=0.11 and p=0.3. Further, y1>w and y2>w. In the present embodiment, w=0.35.

A Zn doped p-type $Al_{y1}Ga_{1-y1}As$ cladding layer 8 having a thickness of t μm is formed on the optical guide layer 7. In the present embodiment, y1=0.45.

A stripe-shaped Zn doped p-type $Al_uGa_{1-u}As$ etching stop layer 9 having a thickness of 200 Å extending in the vertical direction (in the direction of the cavity length), a stripe-shaped Zn doped p-type $Al_{y2}Ga_{1-y2}As$ cladding layer 10 having a thickness of 1.8 μm, and a stripe-shaped Zn doped p-type GaAs cap layer 11 having a thickness of 0.7 μm are formed in this order on an approximately central part of the p-type cladding layer 8. The p-type etching stop layer 9 has a width of W μm. The width W μm becomes the width of an opening forming a current path. Here $1 \geq u > y1$ and $1 \geq u > y2$. In the present embodiment, u=0.7 and y2=0.45. The p-type etching stop layer 9, the p-type cladding layer 10, and p-type cap layer 11 constitute a stripe-shaped ridge portion 12.

An undoped $Al_{z1}Ga_{1-z1}As$ current blocking layer 13 having a thickness of 0.3 μm, an Se doped n-type $Al_{z2}Ga_{1-z2}As$ current blocking layer 14 having a thickness of 0.2 μm, and an Se doped n-type GaAs current blocking layer 15 having a thickness of 0.3 μm are formed in this order on the p-type cladding layer 8 so as to cover the side surface of the ridge portion 12, where $1 \geq z1 > y1$, $1 \geq z1 > y2$, $1 \geq z2 > y1$, and $1 \geq z2 > y2$.

A Zn doped p-type GaAs contact layer 16 having a thickness of 6 μm is formed on the upper surface of the p-type cap layer 11, the end surface of the undoped current blocking layer 13, the end surface of the n-type current blocking layer 14, and the upper surface and the end surface of the n-type current blocking layer 15.

semiconductor laser device shown in FIG. 1 except for the detailed structure of the active layer 6.

In the semiconductor laser device, the current blocking layers 13 and 14 having a stripe-shaped opening (a stripe width W) for restricting a current path as well as forming the current path have larger band gaps and smaller refractive indexes than those of the p-type cladding layers 8 and 10. Consequently, in a light emitting region (a region schematically indicated by an ellipse of a dotted line in FIG. 4), a real refractive index in a region a corresponding to the opening can be made larger than a real refractive index in a region b corresponding to both sides of the opening. Consequently, the semiconductor laser device is operable as a real refractive index guided semiconductor laser device.

By the above-mentioned construction, the current blocking layers 13 and 14 become transparent current blocking layers which are transparent to lasing light.

A real refractive index difference Δn in a case where the semiconductor laser device is not operated (a real refractive index $n_0$ in the region a corresponding to the opening minus a real refractive index $n_s$ in the region b corresponding to both sides of the opening) is changed by selecting the respective Al composition ratios z1 and z2 of the current blocking layers 13 and 14, the thickness t of the p-type cladding layer 8, and the stripe width, to measure maximum light output power Pk obtained when fundamental transverse mode lasing is possible, a horizontal beam divergence $\theta_H$ in the horizontal direction at that time, COD (catastrophic optical damage), and astigmatism. The results are shown in Table 3. In this case, a reflective film having an index of reflection of 12% and a reflective film having an index of reflection of 95% are respectively provided on a front facet and a rear facet of the semiconductor laser device, and the cavity length is set to 600 μm, to make measurements at an ambient temperature of 25° C.

TABLE 3

| No. | t (μm) | Al COMPOSITION RATIO Z1 = Z2 | Δn | W (μm) | Fundamental TRANSVERS MODE LASING | θ ANGLE | Pk (mW) | COD (mW) | ASTIGMATISM (μm) |
|---|---|---|---|---|---|---|---|---|---|
| C1 | 0.25 | 0.52 | 0.0020 | 4.5 | ○ | 5.6 | 115 | 190 | 35 |
| C2 | 0.23 | 0.52 | 0.0024 | 4.8 | ○ | 5.6 | 95 | 175 | 9 |
| C3 | 0.23 | 0.52 | 0.0024 | 4.0 | ○ | 5.5 | 120 | 180 | 7 |
| C4 | 0.23 | 0.52 | 0.0024 | 3.2 | ○ | 5.9 | 145 | 185 | 7 |
| C5 | 0.22 | 0.57 | 0.0028 | 5.0 | ○ | 5.6 | 70 | 200 | 8 |
| C6 | 0.22 | 0.57 | 0.0028 | 4.3 | ○ | 6.0 | 100 | 185 | 6 |
| C7 | 0.22 | 0.57 | 0.0028 | 3.5 | ○ | 6.5 | 110 | 180 | 5 |
| C8 | 0.22 | 0.57 | 0.0028 | 3.2 | ○ | 7.0 | 120 | 150 | 5 |
| C9 | 0.21 | 0.57 | 0.0031 | 4.6 | ○ | 6.1 | 70 | 180 | 7 |
| C10 | 0.21 | 0.57 | 0.0031 | 3.8 | ○ | 7.0 | 100 | 170 | 5 |
| C11 | 0.21 | 0.57 | 0.0031 | 3.3 | ○ | 7.2 | 110 | 150 | 4 |
| C12 | 0.21 | 0.57 | 0.0031 | 2.8 | ○ | 7.6 | 110 | 140 | 5 |
| C13 | 0.21 | 0.57 | 0.0031 | 2.5 | ○ | 7.8 | 100 | 100 | 4 |
| C14 | 0.21 | 0.57 | 0.0031 | 2.0 | ○ | 8.1 | 50 | 50 | 3 |
| C15 | 0.20 | 0.52 | 0.0033 | 4.5 | ○ | 6.7 | 60 | 180 | 7 |
| C16 | 0.20 | 0.52 | 0.0033 | 3.6 | ○ | 7.4 | 95 | 160 | 7 |
| C17 | 0.20 | 0.52 | 0.0033 | 3.2 | ○ | 7.5 | 115 | 150 | 4 |
| C18 | 0.19 | 0.57 | 0.0035 | 4.6 | ○ | 7.1 | 50 | 175 | 6 |
| C19 | 0.17 | 0.57 | 0.0040 | 4.0 | X | 4.6 | 0 | 140 | — |
| C20 | 0.15 | 0.57 | 0.0045 | 4.0 | X | 4.2 | 0 | 150 | — |

A p-side electrode 17 composed of Cr/Au is formed on the p-type contact layer 16, and an n-side electrode 18 composed of Cr/Sn/Au is formed on the lower surface of the n-type substrate 1.

Figure 6:
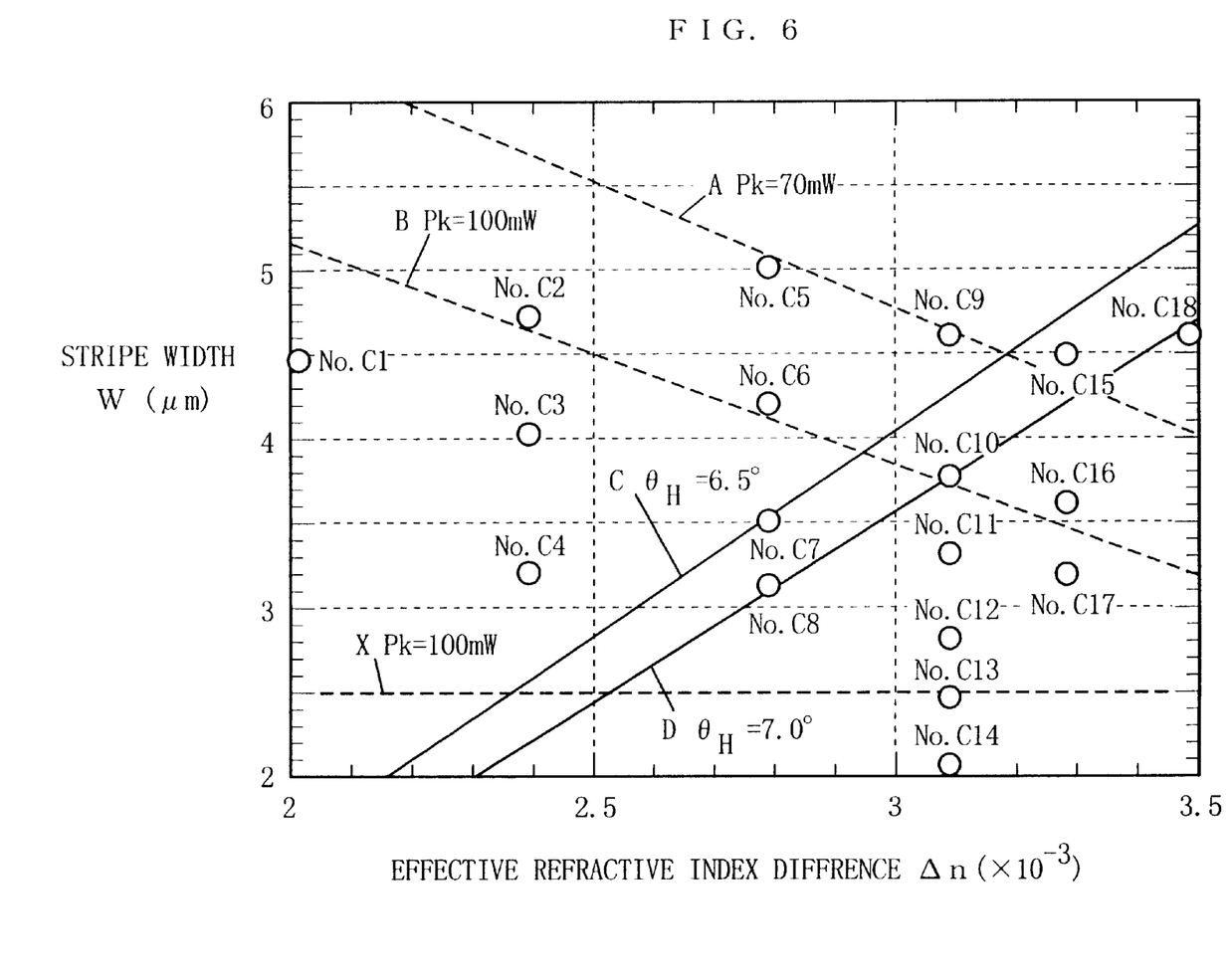
FIG. 6 is a diagram showing the relationship among a real refractive index difference Δn, maximum light output power Pk obtained when fundamental transverse mode lasing is possible, a stripe width W, and a horizontal beam divergence $\theta_H$ in the semiconductor laser device shown in FIG. 4.

A method of fabricating the semiconductor laser device shown in FIG. 4 is the same as the method of fabricating the FIG. 6 shows the relationship among the real refractive index difference Δn, the maximum light output power Pk obtained when fundamental transverse mode lasing is possible, the stripe width W, and the horizontal beam divergence $\theta_H$ which are obtained using samples Nos. C1 to C18 in the Table 3.

FIG. 6 shows that the stripe width W and the real refractive index difference Δn which satisfy a region RA between a straight line A indicated by a dotted line and a straight line X indicated by a dotted line must be selected in order that the maximum light output power Pk is not less than 70 mW, and the stripe width W and the real refractive index difference Δn which satisfy a region RB between a straight line B indicated by a dotted line and the above-mentioned straight line X must be selected in order that the maximum light output power Pk is not less than 100 mW.

Furthermore, FIG. 6 shows that the stripe width W and the real refractive index difference Δn which satisfy a region RC below a straight line C indicated by a solid line, including the straight line C must be selected in order that the horizontal beam divergence $\theta_H$ is not less than 6.5°, and the stripe width W and the real refractive index difference Δn which satisfy a region RD below a straight line D indicated by a solid line, including the straight line D must be selected in order that the horizontal beam divergence $\theta_H$ is not less than 7°.

The straight line A is represented by the following equation (B1):

$$W = -1.33 \times 10^3 [\mu m] \times \Delta n + 8.723 [\mu m] \quad (B1)$$

The straight line B is represented by the following equation (B2):

$$W = -1.33 \times 10^3 [\mu m] \times \Delta n + 7.923 [\mu m] \quad (B2)$$

The straight line X is represented by the following equation (B3):

$$W = 2.5 [\mu m] \quad (B3)$$

The straight line C is represented by the following equation (B4):

$$W = 2.25 \times 10^3 [\mu m] \times \Delta n - 2.8 [\mu m] \quad (B4)$$

The straight line D is represented by the following equation (B5):

$$W = 2.25 \times 10^3 [\mu m] \times \Delta n - 3.175 [\mu m] \quad (B5)$$

Figure 7:
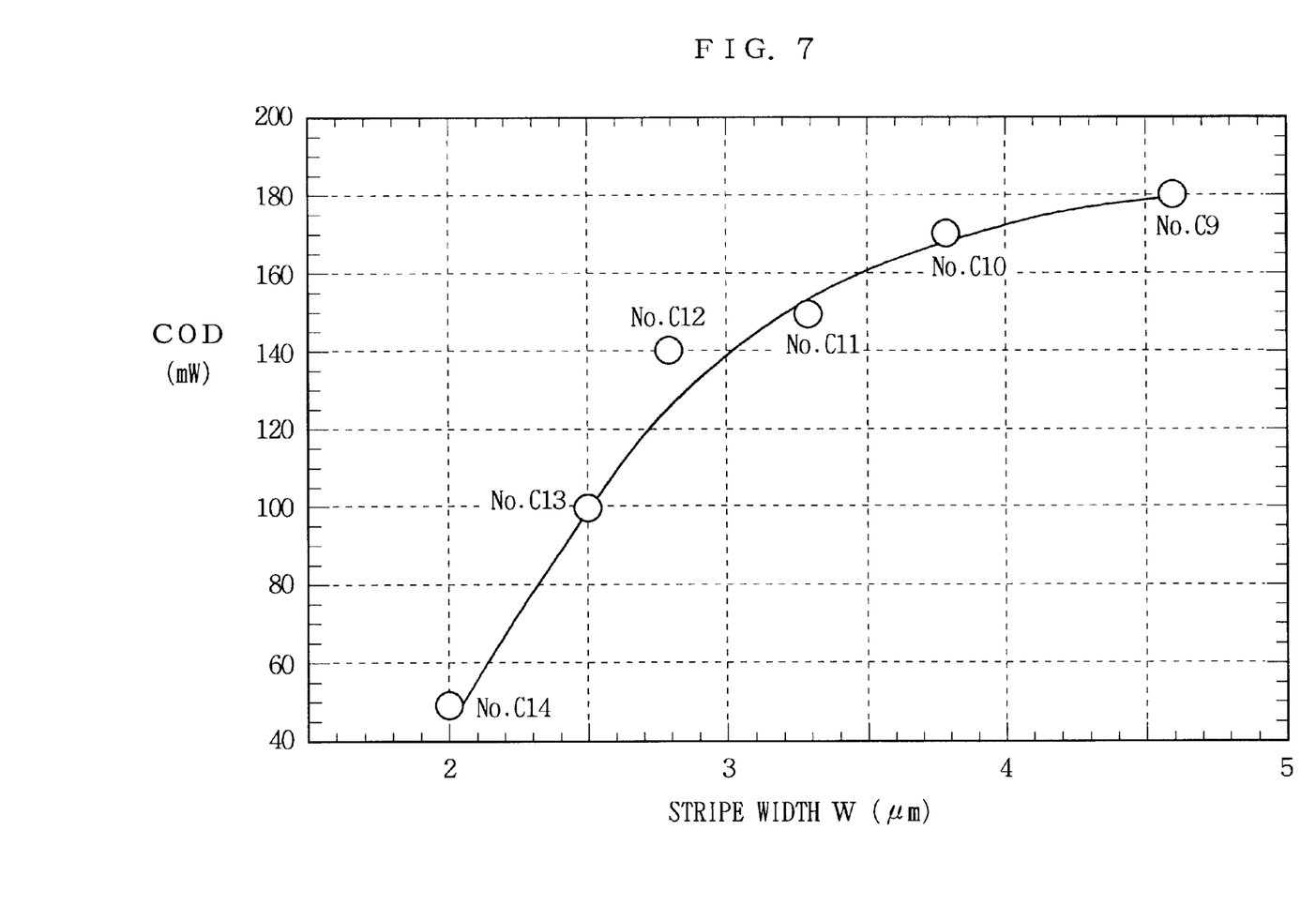
FIG. 7 is a diagram showing the relationship between a stripe width W and COD (catastrophic optical damage) in the semiconductor laser device shown in FIG. 4.

FIG. 7 shows the relationship between the COD and the stripe width W in the samples Nos. C9 to C14 shown in the foregoing Table 3.

As can be seen from FIG. 7 and the Table 3, when the stripe width W is less than 2.5 μm, the COD is less than 100 mW, except that the maximum light output power Pk is less than 100 mW , whereby the life of the semiconductor laser device cannot be lengthened.

Figure 8:
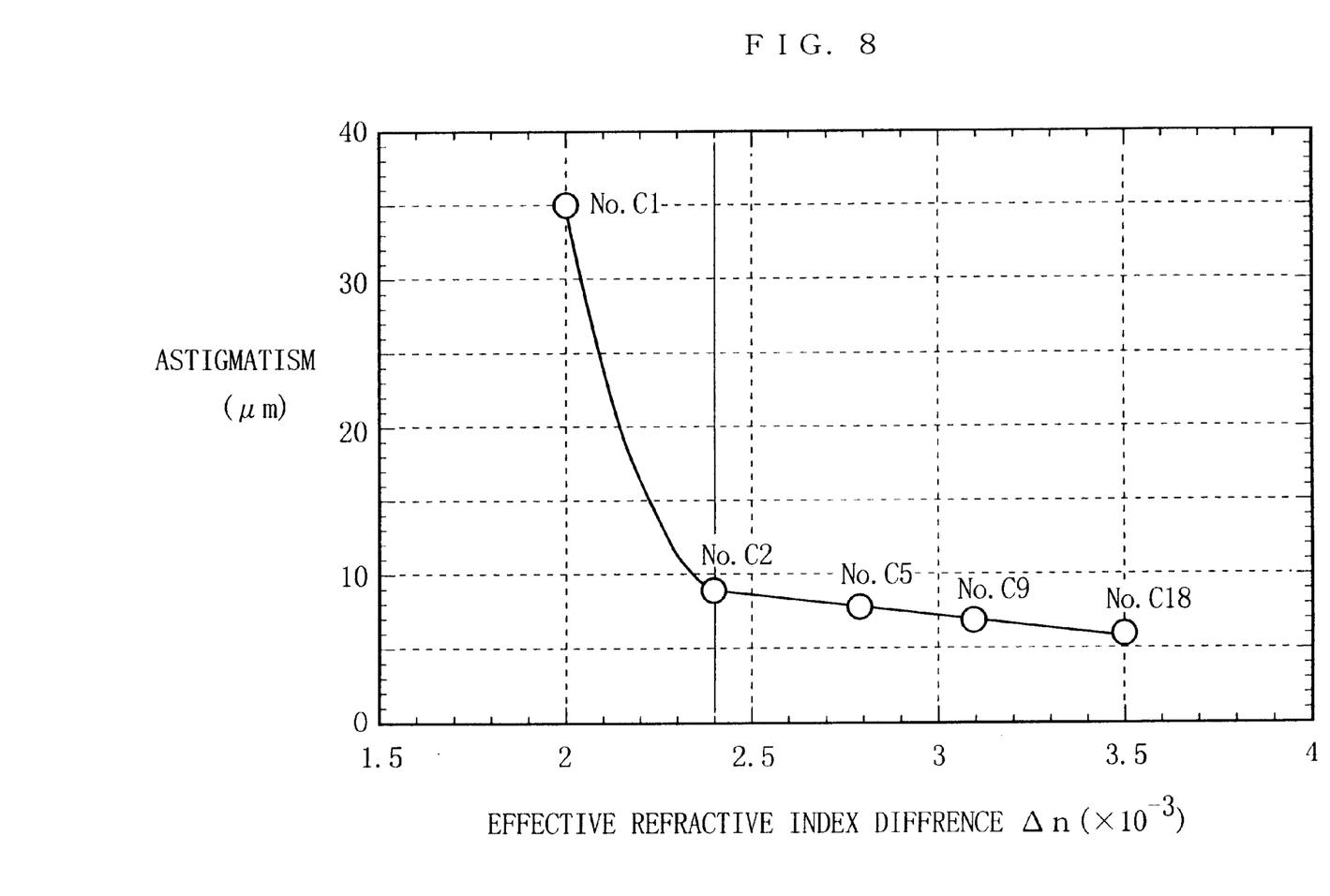
FIG. 8 is a diagram showing the relationship between a real refractive index difference Δn and astigmatism in the semiconductor laser device shown in FIG. 4.

FIG. 8 shows the relationship between the astigmatism and the real refractive index difference Δn in the samples Nos. C1, C2, C5, C9, and C18 shown in the foregoing Table 3.

As can be seen from FIG. 8 and the Table 3, when the real refractive index difference Δn is less than $2.4 \times 10^{-3}$, the astigmatism is rapidly increased. When the astigmatism is thus very large, optical setting in an optical pickup, for example, becomes difficult. Therefore, it is preferable that the real refractive index difference Δn is not less than $2.4 \times 10^{-3}$.

Furthermore, when the real refractive index difference Δn exceeds $3.5 \times 10^{-3}$, transverse mode lasing becomes unstable, and fundamental transverse mode lasing becomes difficult, as shown in the Table 3. Consequently, it is preferable that the real refractive index difference Δn is not less than $2.4 \times 10^{-3}$ nor more than $3.5 \times 10^{-3}$.

It is desired that the maximum light output power Pk is not less than 70 mW and the horizontal beam divergence $\theta_H$ is not less than 6.5° in a semiconductor laser device serving as a light source for a rewritable optical disc. In the present invention, therefore, the stripe width W and the real refractive index difference Δn are so selected as to satisfy an area where the region RA and the region RC are overlapped with each other and a range in which the real refractive index difference Δn is not less than $2.4 \times 10^{-3}$ nor more than $3.5 \times 10^{-3}$.

That is, the stripe width W and the real refractive index difference Δn satisfy the following equations:

$$2.4 \times 10^3 \leq \Delta n \leq 3.5 \times 10^{-3}$$

$$W \leq -1.33 \times 10^3 [\mu m] \times \Delta n + 8.723 [\mu m]$$

$$W \leq 2.25 \times 10^3 [\mu m] \times \Delta n - 2.8 [\mu m]$$

$$W \geq 2.5 [\mu m]$$

It is preferable that the following relationship is satisfied in addition to the foregoing relationships in order that the maximum light output power Pk is not less than 100 mW:

$$W \leq -1.33 \times 10^3 [\mu m] \times \Delta n + 7.923 [\mu m]$$

It is more preferable that the following relationship is satisfied in order that the horizontal beam divergence $\theta_H$ is not less than 7°:

$$W \leq 2.25 \times 10^3 [\mu m] \times \Delta n - 3.175 [\mu m]$$

It is still more preferable that the following relationships are satisfied in order that the maximum light output power Pk is not less than 100 mW, and the horizontal beam divergence $\theta_H$ is not less than 7°:

$$2.4 \times 10^3 \leq \Delta n \leq 3.5 \times 10^{-3}$$

$$W \geq 2.5 [\mu m]$$

$$W \leq 1.33 \times 10^3 [\mu m] \times \Delta n - 0.323 [\mu m]$$

$$W \leq 2.25 \times 10^3 [\mu m] \times \Delta n - 3.175 [\mu m]$$

Furthermore, a current blocking layer having a large band gap (having a high Al composition ratio) is relatively inferior in crystallinity. As a result, impurities may be diffused into the active layer 6 from the current blocking layer in growing the current blocking layer again. Moreover, the thickness of the p-type cladding layer 8 is set to a small value and preferably not more than 0.25 μm in order that the semiconductor laser device is formed into a real refractive index guided semiconductor laser device to reduce an unavailing current. In order to prevent the above-mentioned dispersion, therefore, the current blocking layer 13 on the side of the active layer 6 is preferably formed into a low impurity layer such as an undoped layer as in the present embodiment, and more preferably formed into an undoped layer as described above.

Although in the above-mentioned second embodiment, a multi quantum well structure layer composed of $Al_qGa_{1-q}As$ quantum well layers and $Al_pGa_{1-p}As$ barrier layers (P>q≧0) is used as the active layer 6, a single quantum well layer composed of $Al_qGa_{1-q}As$ (q≧0) may be used. Alternatively, a layer having no quantum effect composed of $Al_qGa_{1-q}As$ (q≧0) may be used.

Although in the above-mentioned first and second embodiments, the etching stop layer 9 exists between the p-type cladding layers 8 and 10, that is, in the p-type etching stop layer, the cladding layer 9 need not be provided, provided that the decrease in yield is allowed.

In the above-mentioned first and second embodiments, the respective Al composition ratios x, y1, and y2 of the AlGaAs cladding layers 4, 8, and 10 can be suitably selected in the range of not less than 0.4 nor more than 0.6, the respective Al composition ratios z1 and z2 of the current blocking layers 13 and 14, which are higher than the respective Al composition ratios y1 and y2 of the AlGaAs cladding layers 8 and 10, having a stripe-shaped opening having a predetermined width for restricting a current path as well as forming the current path and adjacent to each other are set to be more than the respective Al composition ratios y1 and y2 of the AlGaAs cladding layers 8 and 10 by at least 0.02.

However, it is confirmed by experiments that when AlGaAs is inferior in crystallinity and is easily oxidized when the Al composition ratio thereof is more than 0.6, so that crystal growth thereon becomes difficult. Therefore, it is preferable that the respective Al composition ratios z1 and z2 of the current blocking layers 13 and 14 are set to not more than 0.6.

Furthermore, although in the above-mentioned first and second embodiments, the n-type AlGaAs current blocking layer 14 and the undoped current blocking layer 13 have the same Al composition ratio, the current blocking layer 14 and the current blocking layer 13 may have different Al composition ratios. Further, the semiconductor laser device may comprise only one of the current blocking layers 13 and 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising in the order listed:

a cladding layer of a first conductivity type;
   an active layer;
   a cladding layer of a second conductivity type; and
   a current blocking layer transparent to lasing light, having a stripe-shaped opening of a predetermined width for restricting a current path and forming the current path, and having a larger band gap than that of said cladding layer of the second conductivity type and having a smaller refractive index than that of said cladding layer of the second conductivity type,
   said cladding layer of the second conductivity type having a flat portion and a stripe-shaped ridge portion on said flat portion,
   said ridge portion being positioned in said opening of said current blocking layer,
   said current blocking layer being so formed as to cover the upper surface of said flat portion and the side surface of said ridge portion, and
   a different $\Delta n$ between an effective refractive index in a region, which corresponds to said opening, in said active layer and an effective refractive index in a region, which corresponds to both sides of said opening, in said active layer and the width W ($\mu$m) of said opening satisfying the following relationship:

$\Delta n \geq 2 \times 10_{-3}$, $W \leq -1.6 \times 10_3 \times \Delta n + 9.3$, and $W \geq 3.0$, wherein said cladding layer of the first conductivity type is composed of $Al_xGa_{1-x}As$, said active layer is composed of $Al_qGa_{1-q}As$ ($1 > x > q \geq 0$), said cladding layer of the second conductivity type is composed of $Al_yGa_{1-y}As$ (y>q), and said current blocking layer is composed of $Al_zGa_{1-z}As$.

2. The semiconductor laser device according to claim 1, wherein
   the difference $\Delta n$ between the effective refractive indexes and the width W of said opening satisfy the following relationship:

$W \leq -1.5 \times 10^3 \times \Delta n + 8.55$.

3. The semiconductor laser device according to claim 1, wherein
   said current blocking layer comprises an Al,
   the difference $\Delta n$ between the effective refractive indexes is set by selecting the Al composition ratio of said current blocking layer and the thickness of said cladding layer of the second conductivity type on the both sides of the opening.

4. The semiconductor laser device according to claim 3, wherein
   the Al composition ratio z of said current blocking layer is higher than the Al composition ratio y of said cladding layer of the second conductivity type.

5. The semiconductor laser device according to claim 3, wherein
   the Al composition ratio z of said current blocking layer is not more than 0.6.

6. The semiconductor laser device according to claim 1, wherein
   the width of said ridge portion at a distance away from said active layer decreases as the distance increases.

7. The semiconductor laser device according to claim 1, wherein
   said current blocking layer comprises at least a layer of said first conductivity type.

8. The semiconductor laser device according to claim 1, wherein
   said current blocking layer comprises a first layer formed on said active layer and a second layer formed on said first layer,
   said second layer is of said first conductivity type,
   said first layer is undoped or is of said first conductivity type, and having a lower impurity concentration than that of said second layer.

9. The semiconductor laser device according to claim 8, further comprising a second current blocking layer including a third layer formed on said second layer.

10. The semiconductor laser device according to claim 9, wherein said third layer is of said first conductivity type.

11. The semiconductor laser device according to claim 9, wherein said third layer is composed of GaAs.

12. A semiconductor laser device according to claim 1, wherein said difference $\Delta n$ achieves a maximum light output power not less than 100 mW for said semiconductor laser device.

13. The semiconductor laser device according to claim 2, wherein said difference $\Delta n$ achieves a maximum light output power not less than 150 mW for said semiconductor device.

14. A method of designing a semiconductor laser device comprising a cladding layer of a first conductivity type composed of $Al_xGa_{1-x}As$, an active layer composed of $Al_qGa_{1-q}As$ (1>x>q≧0), a cladding layer of a second conductivity type composed of $Al_yGa_{1-x}As$, (y>q), and a current blocking layer, transparent to lasing light, having a stripe-shaped opening having a predetermined width for restricting a current path and forming the current path and composed of $Al_zGa_{1-z}As$ (1≧z>y) in this order, comprising the steps of:

setting the different Δn between an effective refractive index in a region, which corresponds to said opening, in said active layer and an effective refractive index in a region, which corresponds to both sides of said opening, in said active layer and the width W of said opening in order that a maximum light output power not less than 100 mW is obtained in fundamental transverse mode lasing; and selecting the Al composition ratio z of said current blocking layer and the thickness of said cladding layer of the second conductivity type on the both sides of the opening in order that said different Δn between the effective refractive indexes is obtained, wherein said setting step comprising the step of setting said difference Δn between the effective refractive indexes and the width W ($\mu$m) of said opening in order to satisfy the following relationships:

$\Delta n \geq 2 \times 10_{-3}$, and $W \leq -1.6 \times 10_3 \times \Delta n + 9.3$.

15. The method according to claim 14, wherein
said setting step comprises the step of setting said difference Δn between the real refractive indexes and the width W [$\mu$m] of said opening in order to satisfy the following relationship:

$W \leq -1.5 \times 10^3 \times \Delta n + 8.55$.

16. The method according to claim 14, wherein
said setting step comprises the step of setting the width W of said opening to not less than 3.0 $\mu$m.

17. The method according to claim 14, wherein
said cladding layer of the second conductivity type comprises a flat portion and a stripe-shaped ridge portion on said flat portion,
said ridge portion being positioned in said opening of said current blocking layer,
said current blocking layer being so formed as to cover the upper surface of said flat portion and the side surface of said ridge portion.

18. The method according to claim 17, wherein
the width of said ridge portion at a distance away from said active layer decreases as the distance increases.

19. The semiconductor laser device according to claim 14, wherein
said current blocking layer comprises a first layer formed on said active layer and a second layer formed on said first layer,
said second layer being of said first conductivity type,
said first layer is undoped or is of said first conductivity type, and having a lower impurity concentration than that of said second layer.

20. The semiconductor laser device according to claim 19, further comprising a second current blocking layer including a third layer formed on said second layer.

21. The semiconductor laser device according to claim 20, wherein said third layer is of said first conductivity type.

22. The semiconductor laser device according to claim 20, wherein said third layer is composed of GaAs.

23. A semiconductor laser device comprising in the order listed:

a cladding layer of a first conductivity type;
an active layer;
a cladding layer of a first conductivity type;
an active layer;
a cladding layer of a second conductivity type; and
a current blocking layer transparent to lasing light, having a stripe-shaped opening of a predetermined width for restricting a current path and forming the current path, and having a larger band gap than that of said cladding layer of the second conductivity type and having a smaller refractive index than that of said cladding layer of the second conductivity type, said cladding layer of the second conductivity type having a flat portion and a stripe-shaped ridge portion on said flat portion, said ridge portion being positioned in said opening of said current blocking layer, said current blocking layer being so formed as to cover the upper surface of said flat portion and the side surface of said ridge portion, a difference Δn being an effective refractive index in a region, which corresponds to said opening, in said active layer and an effective refractive index in a region, which corresponds to both sides of said opening, in said active layer and the width W ($\mu$m) of said opening satisfying the following relationships:

$2.4 \times 10^{-3} \leq \Delta n \leq 3.5 \times 10^{-3}$, $W \geq 2.5$, $W \leq -1.33 \times 10^3 \times \Delta n + 8.723$, and $W \leq 2.55 \times 10^3 \times \Delta n - 2.8$, wherein said cladding layer of the first conductivity type is composed of $Al_xGa_{1-x}As$, said active layer is composed of $Al_qGa_{1-q}As$ (1>x>q ≧0), said cladding layer of the second conductivity type is composed of $Al_yGa_{1-y}As$ (y>q), and said current blocking layer is composed of $Al_zGa_{1-z}As$.

24. The semiconductor laser device according to claim 23, wherein
said difference Δn between the real refractive indexes and the width W [$\mu$m] of said opening satisfy the following relationship:

$W \leq -1.33 \times 10^3 \times \Delta n + 7.923$.

25. The semiconductor laser device according to claim 23, wherein
the difference Δn between the real refractive indexes and the width W [$\mu$m] of said opening satisfy the following relationship:

$W \leq 2.25 \times 10^3 \times \Delta n - 3.175$.

26. The semiconductor laser device according to claim 23, wherein
said current blocking layer comprises an Al,
the difference Δn between the real refractive indexes is set by selecting the Al composition ratio of said current blocking layer and the thickness of said cladding layer of the second conductivity type on the both sides of the opening.

27. The semiconductor laser device according to claim 23, wherein the Al composition ratio z of said current blocking layer is higher than the Al composition ratio y of said cladding layer of the second conductivity type.

28. The semiconductor laser device according to claim 23, wherein the Al composition ratio z of said current blocking layer is not more than 0.6.

29. The semiconductor laser device according to claim 23, wherein the width of said ridge portion at a distance away from said active layer decreases as the distance increases.

30. The semiconductor laser device according to claim 23, wherein said current blocking layer comprises at least a layer of said first conductivity type.

31. The semiconductor laser device according to claim 16, wherein said current blocking layer comprises a first layer formed on said active layer and a second layer formed on said first layer, said second layer is of said first conductivity type, said first layer is undoped or is of said first conductivity type, and having a lower impurity concentration than that of said second layer.

32. The semiconductor laser device according to claim 31, further comprising a second current blocking layer including a third layer formed on said second layer.

33. The semiconductor laser device according to claim 32, wherein said third layer is of said first conductivity type.

34. The semiconductor laser device according to claim 32, wherein said third layer is composed of GaAs.

35. A semiconductor laser device according to claim 23, wherein said difference $\Delta n$ achieves a maximum light output power not less than 70 mW and a horizontal beam divergence not less than 6.5° for said semiconductor laser device.

36. The semiconductor laser device according to claim 24, wherein said difference $\Delta n$ achieves a maximum light output power not less than 100 mW for said semiconductor laser device.

37. The semiconductor laser device according to claim 25, wherein said difference $\Delta n$ achieves a horizontal beam divergence not less than 7° for said semiconductor device.

38. A method of designing a semiconductor laser device comprising a cladding layer of a first conductivity type composed of $Al_xGa_{1-x}As$, an active layer composed of $Al_qGa_{1-q}As$ ($1>x>q \geq 0$), a cladding layer of a second conductivity type composed of $Al_yGa_{1-y}As$ ($y>q$), and a current blocking layer, transparent to lasing light, having a stripe-shaped opening having a predetermined width for restricting a current path and forming the current path and composed of $Al_zGa_{1-z}As$ ($1 \geq z > y$) in this order, comprising the steps of:

setting a different $\Delta n$ between an effective refractive index in a region, which corresponds to said opening, in said active layer and an effective refractive index in a region, which corresponds to both sides of said opening, in said active layer and the width W of said opening in order that a maximum light output power not less than 70 mW and a horizontal beam divergence not less than 6.5° are obtained in fundamental transverse mode lasing; and selecting the Al composition ratio z of said current blocking layer and the thickness of said cladding layer of the second conductivity type on the both sides of the opening in order that said difference $\Delta n$ between the effective refractive indexes is obtained, wherein said setting step comprises the step of setting said difference $\Delta n$ between the effective refractive indexes and the width W ($\mu$m) of said opening in order to satisfy the following relationships:

$2.4 \times 10^{-3} \leq \Delta n \leq 3.5 \times 10^{-3}$, $W \geq 2.5$, $W \leq -1.33 \times 10^3 \times \Delta n + 8.723$, and $W \leq 2.55 \times 10^3 \times \Delta n - 2.8$.

39. The method according to claim 38, wherein said setting step comprises the step of setting said difference $\Delta n$ between the effective refractive indexes and the width W ($\mu$m) of said opening in order to satisfy the following relationship:

$W \leq -1.33 \times 10^3 \times \Delta n + 7.923$ so that the maximum light output power is not less than 100 mW.

40. The method according to claim 38, wherein said setting step comprises the step of setting said difference $\Delta n$ between the effective refractive indexes and the width W ($\mu$m) of said opening in order to satisfy the following relationship:

$W \leq 2.25 \times 10^3 \times \Delta n - 3.175$ so that the horizontal beam divergence is not less than 7°.

41. The method according to claim 38, wherein said cladding layer of the second conductivity type comprises a flat portion and a stripe-shaped ridge portion on said flat portion, said ridge portion being positioned in said opening of said current blocking layer, said current blocking layer being so formed as to cover the upper surface of said flat portion and the side surface of said ridge portion.

42. The method according to claim 41, wherein the width of said ridge portion at a distance away from said active layer decreases as the distance increases.

43. The semiconductor laser device according to claim 38, wherein said current blocking layer comprises a first layer formed on said active layer and a second layer formed on said first layer, said second layer being of said first conductivity type, said first layer is undoped or is of said first conductivity type, and has a lower impurity concentration than that of said second layer.

44. The semiconductor laser device according to claim 43, further comprising a second current blocking layer including a third layer formed on said second layer.

45. The semiconductor laser device according to claim 44, wherein said third layer is of said first conductivity type.

46. The semiconductor laser device according to claim 44, wherein said third layer is composed of GaAs.

* * * * *